United States Patent [19]
Love

[11] Patent Number: 5,161,124
[45] Date of Patent: Nov. 3, 1992

[54] BOND PROGRAMMABLE INTEGRATED CIRCUIT

[75] Inventor: Andrew M. Love, Stafford, Tex.

[73] Assignee: Texas Instruments Incorporated, Dallas, Tex.

[21] Appl. No.: 712,388

[22] Filed: Jun. 10, 1991

Related U.S. Application Data

[63] Continuation of Ser. No. 263,590, Oct. 27, 1988, Pat. No. 5,023,843.

[51] Int. Cl.$^5$ ............................................. G11C 13/00
[52] U.S. Cl. ...................................... 361/222; 365/51; 365/63
[58] Field of Search ....................... 365/63, 51, 222, 52

[56] References Cited

U.S. PATENT DOCUMENTS

| | | | |
|---|---|---|---|
| 3,737,879 | 6/1973 | Greene et al. | 365/222 |
| 4,789,966 | 12/1988 | Ozaki | 365/189 |
| 4,808,844 | 2/1989 | Ozaki et al. | 307/243 |

Primary Examiner—Terrell W. Fears
Attorney, Agent, or Firm—Ronald O. Neerings; Lawrence J. Bassuk; Richard L. Donaldson

[57] ABSTRACT

The described embodiments of the present invention provide a circuit and method for programming the mode options of an integrated circuit. The embodiment described provides this function for a dynamic random access memory but is applicable to any integrated circuit. The integrated circuit includes programming bonding pads which are either connected to a selected reference potential or left unconnected. Circuitry on the integrated circuit determines whether the pad is connected to the reference potential or is unconnected, and provides logical signals on the integrated circuit which select the operational mode of the integrated circuit. An additional feature of the described embodiment is a continuous checking to determine if the appropriate connected or unconnected state is being detected. This feature provides stray fields and other erroneous signals from altering the mode operation of the integrated circuit.

31 Claims, 4 Drawing Sheets

BOND PROGRAMMABLE INTEGRATED CIRCUIT

This is a continuation of application Ser. No. 07/263,590, filed Oct. 27, 1988, now U.S. Pat. No. 5,023,843.

FIELD OF THE INVENTION

The present invention relates to the field of integrated circuit design. More specifically, the present invention relates to techniques for providing integrated circuits having several different modes of operation using a fundamental design and programming the integrated circuit at a late manufacturing stage.

BACKGROUND OF THE INVENTION

To be responsive to customers' needs, integrated circuit manufacturers strive to have a wide variety of integrated circuit types to satisfy their customers' needs. Many of these different types are minor modifications of chips that are fundamentally similar. An example of that is the different mode types of dynamic random access memories (DRAMS) which are provided. Some examples of different modes of operations are providing 1-bit output data, 4-bit output data, 8-bit output data, static column and page modes. Each of these modes may help the performance of a system in its own particular way. However, fundamentally each provides the function of storing a set amount of data.

In order to expedite design time and minimize manufacturing costs, integrated circuit manufacturers have designed several mode types into a fundamental design. Some of these multiple design integrated circuits are programmed by providing different metal configurations in the last metalization step. The photomasking for this metalization step may be easily changed in the production line or partially finished integrated circuits may be stored in order to quickly perform the final masking step and quickly provide the desired integrated circuit to the customer. This has been an effective strategy in the industry, but still requires changes to be made in the relatively complicated metalization masking step of the integrated circuit fabrication process. In addition, until the final protective layers are placed over the top of the integrated circuit, the integrated circuit remains very vulnerable to contamination.

Another method devised for providing multiple mode functions is the provision of a pin of the integrated circuit to alter the mode of the integrated circuit depending on the signal provided to that pin. Thus a logical 1 or 0 placed on the mode pin or pins effects the appropriate functional operation. This concept has been carried one step further by obtaining the signal inside of the integrated circuit package by bonding the mode selection bonding pads directly to the appropriate one of a positive voltage supply for logical 1 or ground for a logical 0. This bond programability provides a better solution than changing the metalization by moving the programming step downstream from the integrated circuit manufacturing process to the packaging step. However, each bond pad must be properly connected providing undue complexity in the packaging stage.

SUMMARY OF THE INVENTION

The described embodiments of the present invention provide a circuit and method for programming the mode options of an integrated circuit. The embodiment described provides this function for a dynamic random access memory but is applicable to any integrated circuit. The integrated circuit includes programming bonding pads which are either connected to a selected reference potential or left unconnected. Programming mode circuitry on the integrated circuit determines whether the pad is connected to the reference potential or is unconnected and provides logical signals on the integrated circuit that select the operational mode of the integrated circuit. An additional feature of the described embodiment is a continuous or repetitive checking to determine if the appropriate connected or unconnected state is being detected or to refresh the sensing of the programmed state. This feature prevents stray fields and other erroneous signals from altering the mode operation of the integrated circuit.

BRIEF DESCRIPTION OF THE DRAWINGS

The present invention is best understood with regard to the embodiments described in the following detailed description of the preferred embodiments and in conjunction with the drawings wherein.

DETAILED DESCRIPTION

Figure 1:
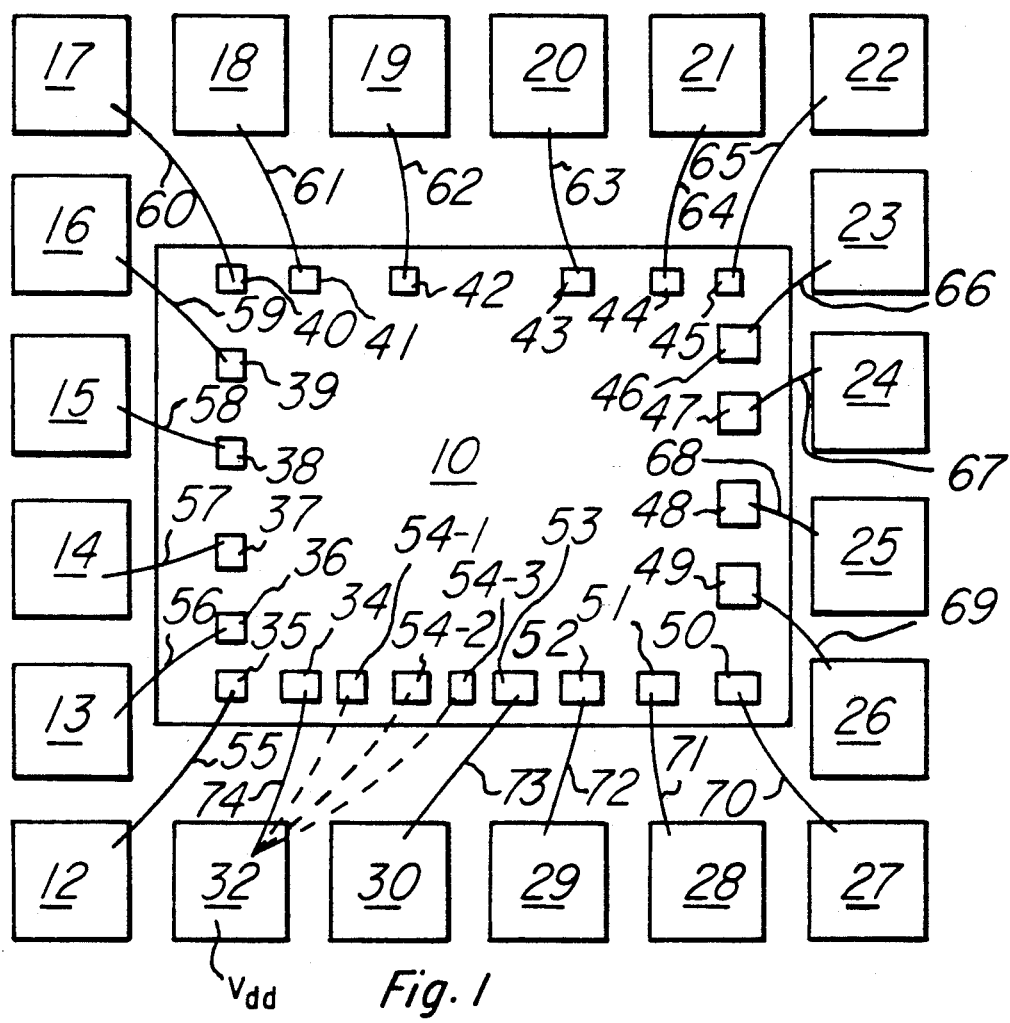
FIG. 1 is a schematic diagram showing an integrated circuit-situated in a lead frame with its bond pads schematically connected to the lead pads of the lead frame.
Figure 2:
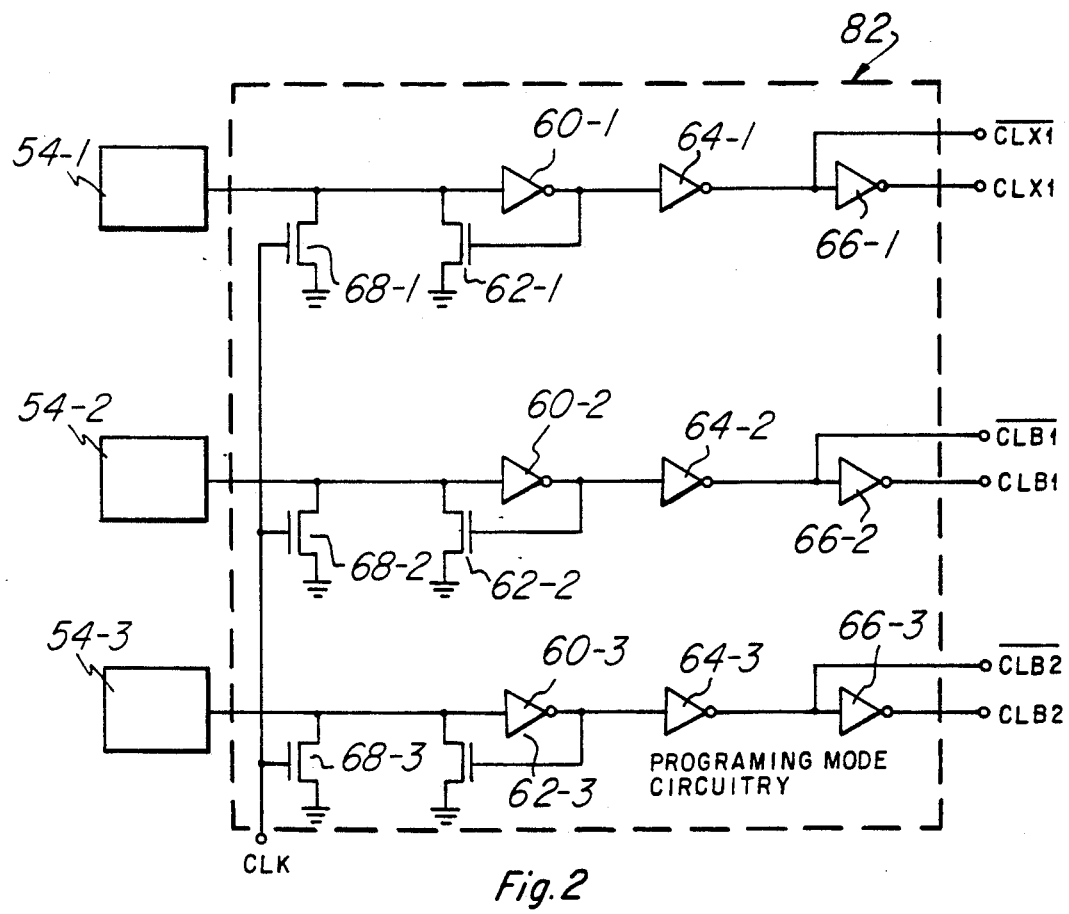
FIG. 2 is a schematic diagram showing the programming mode circuitry on the integrated circuit connected to the programming bond pads.
Figure 3:
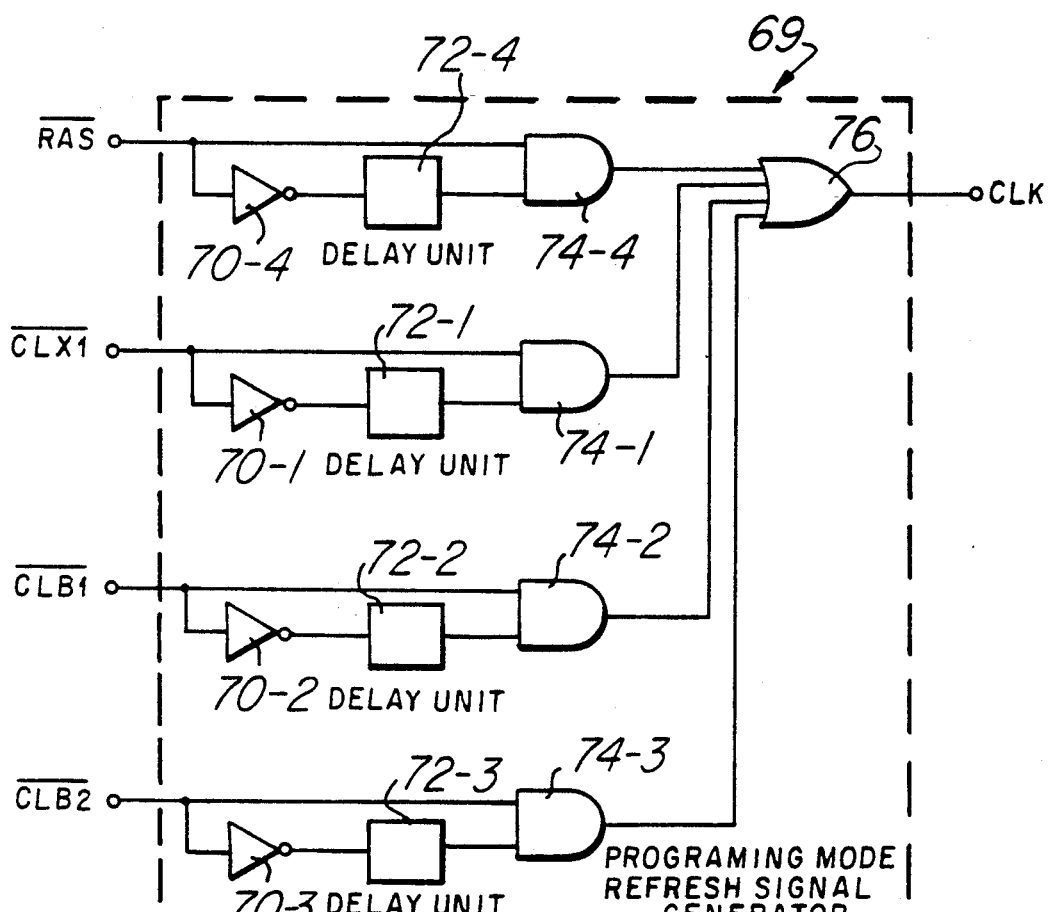
FIG. 3 is a logic diagram describing the circuitry used to generate the refresh signal.
Figure 4:
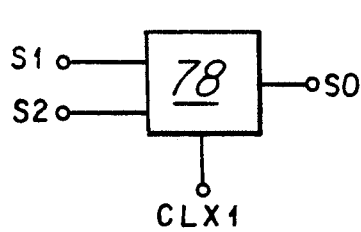
FIG. 4 is a block diagram showing the use of the programming signal to select between two signals to be provided on the integrated circuit.
Figure 5:
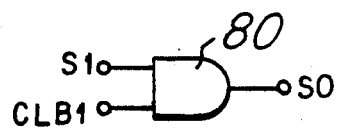
FIG. 5 is a logic diagram showing an AND gate providing a pass through function for a programmed signal on the integrated circuit.
Figure 6:
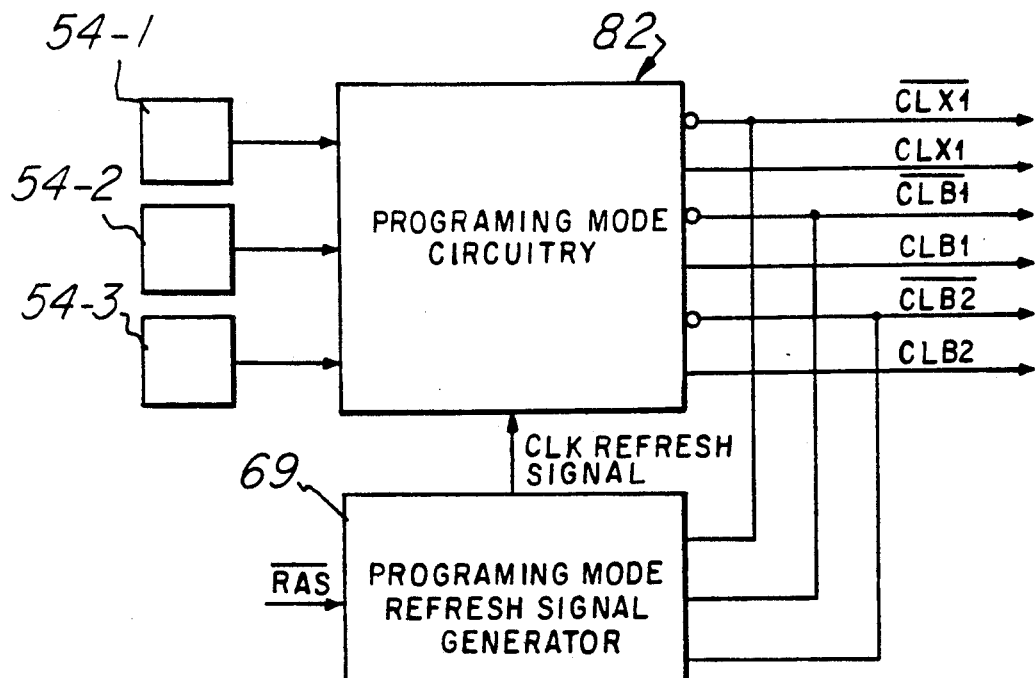
FIG. 6 is a block diagram of the preferred embodiment of the invention.

The described embodiment of the present invention is a dynamic random access memory using three bond pads to provide programability with respect to the mode of operation of the dynamic random access memory. The choice of a dynamic random access memory is provided for exemplary purposes only and is not to be construed as limiting the invention to use in DRAMS, random access memories or memories at all. The present invention is equally applicable to any integrated circuit to provide mode programability at a late stage of manufacturing. The described embodiment is described with regard to FIGS. 1–6. FIG. 1 is a schematic diagram showing the bonding lead pads of a lead frame surrounding an integrated circuit with bonding wires schematically indicated from the lead pads of the lead frame to bonding pads on the integrated circuit. FIG. 2 is a schematic diagram showing the programming mode circuitry on the integrated circuit connected to the programming bond pads. FIG. 3 is a schematic logic diagram showing a programming mode refresh signal generator. FIG. 4 is a block diagram of a multiplexer indicating how a signal from the programming circuitry can select one signal or another. FIG. 5 is a logic diagram showing the use of an AND gate to determine whether a signal is provided or not to. FIG. 6 depicts a block diagram of the preferred embodiment.

FIG. 1 is a schematic diagram showing the positioning of an integrated circuit 10 between the lead frame lead pads 12–32 including $V_{dd}$ lead pad 32. These lead pads are connected to bond pads 34 through 53 and programming bond pads 54-1, 54-2 and 54-3 by bonding wires 55 through 74. The signals provided to bond pads 34 through 53 are the normal signals utilized in an integrated circuit of the type of integrated circuit 10. In this example, integrated circuit 10 is a dynamic random access memory and signals such as address signals, data output signals, row address strobe and column address strobe are provided via these bond pads. Bond pads 54-1, 54-2 and 54-3 are selectively connected to lead pad 32 depending upon the selected programmable mode configuration of the integrated circuit thus provided.

The programmable mode circuitry connected to bond pads 54-1, 54-2 and 54-3 is designed to detect whether $V_{dd}$ is connected to those bond pads. $V_{dd}$ is selected as an arbitrary reference voltage and another reference voltage such as $V_{ss}$ may be suitably used. After mounting the integrated circuit onto the lead frame and placing the bond wires, the entire assembly is encapsulated in plastic (not shown) by injection molding excepting the ends of the lead frame, which form the lead pins for connection to the circuit board (not shown). In a preferred embodiment, these lead pins form two in-line rows. This is known in the industry as a "dual in-line package" and is a standard package. Of course, many other types of packages may be suitably used such as ceramic packaging or surface mounting techniques.

FIGS. 2 and 6 are schematic diagrams showing the programming mode circuitry 82 connected to bond pads 54-1 through 54-3. When $V_{dd}$ is connected to bond pad 54-1, the high voltage signal is inverted once by inverter 60-1 which provides a low signal to the gate of transistor 62-1. Thus transistor 62-1 does not pull the input terminal of inverter 60-1 to ground. The low voltage signal provided by inverter 60-1 is inverted again by inverter 64-1 which provides a logical 1 (high voltage) output complementary signal as signal $\overline{CLX1}$. This signal is inverted once again by inverter 66-1 to provide true signal CLX1. When bond pad 54-1 is not connected, an initializing or refreshing high voltage signal is provided as input refresh signal CLK (this signal occurs on power up by the transition of the row address strobe ($\overline{RAS}$) signal, which is provided to the CLK refresh signal generating circuit as described below) which causes refresh transistor 68-1 to conduct in a source to drain path to ground. The CLK refresh signal appears on the gate of transistor 68-1. This pulls the input signal of inverter 60-1 to a low voltage signal. This is inverted once by inverter 60-1 to provide a high voltage signal on the gate of latch transistor 62-1. Thus, transistor 62-1 is on (conductive between its source and drain path) and the input terminal of inverter 60-1 is pulled to and maintained at a low voltage level. The high voltage output signal of inverter 60-1 is inverted once by inverter 64-1 to provide signal $\overline{CLX1}$. This signal is inverted once again by inverter 66-1 to provide signal CLX1. If no signal is provided to bond pad 54-1 the circuitry of FIG. 2 automatically provides the appropriate signal on CLX1 and $\overline{CLX1}$ because inverter 60-1 and transistor 62-1 operate as a logical 0 latch and the input terminal of inverter 60-1 is periodically pulled to ground. Similarly numbered components connected to bond pad 54-2 and bond pad 54-3 operate in a similar manner. Additionally, the circuit comprising inverter 60-1 and transistor 62-1 is designed such that the output signal of inverter 60-1 tends to assume a high voltage state when the external power supply voltage ($V_{dd}$) is applied to the integrated circuit, unless bond pad 54-1 is connected to $V_{dd}$. This causes $\overline{CLX1}$, $\overline{CLB1}$, $\overline{CLB2}$ to assume the proper state even before a transition of $\overline{RAS}$.

FIGS. 3 and 6 are schematic diagrams of the circuitry (furnishing the programming mode refresh signal generator 69) used to generate the CLK refresh signal used in FIG. 2. Signal generator 69 receives as input signals the $\overline{CLX1}$, $\overline{CLB1}$, $\overline{CLB2}$ and row address strobe ($\overline{RAS}$) signals. The $\overline{RAS}$ signal is a commonly used signal in DRAMs. It may be provided to the DRAM or generated on chip. It is selected in this embodiment because it is a signal which undergoes numerous repetitive transitions. Under normal operation of the integrated circuit, the other three input signals remain stable. Thus, for example, the $\overline{CLX1}$ signal is inverted once by inverter 70-1 and is delayed a certain period of time by delay unit 72-1. Thus a logical 1 and logical 0 are provided to AND gate 74-1 and a logical 0 is provided to OR gate 76. When $\overline{CLB1}$, $\overline{CLB2}$ and $\overline{RAS}$ are also quiescent, all input signals to OR gate 76 are a logical 0 and the CLK signal is a continuous logical 0. If, for example, an erroneous transition occurs on the signal provided on $\overline{CLX1}$ from a logical 0 to a logical 1, a logical 1 is provided directly to the input of AND gate 74-1. A certain amount of time is required for the signal transition to propagate through inverter 70-1 and delay unit 72-1. Thus for a selected period of time, selected by the delay amount of delay unit 72-1 and the propagation delay of inverter 70-1, both input signals to AND gate 74-1 are logical 1 and a logical 1 output signal is provided to the input terminals of OR gate 76. Thus OR gate 76 provides a logical 1 CLK signal. This furnishes the initializing or refreshing high voltage signal described relating to the programming mode circuitry of FIG. 2.

Since $\overline{CLX1}$, $\overline{CLB1}$ and $\overline{CLB2}$ are intended to be stable signals, a transition on any of these indicates that an error event has occured. If, for example, bond pad 54-1 is unbonded, $\overline{CLX1}$ should be a logical 0. Therefore, a logical 0 to logical 1 transition occurring on $\overline{CLX1}$ indicates that the unbonded bond pad 54-1 has erroneously gone to a high voltage state or some other source of error has occurred, possibly due to electrical noise. In this event, CLK refresh signal pulses to a logical 1 and transistor 68-1 pulls the input signal of inverter 60-1 to its proper state, effectively refreshing the states of the circuitry connected to the programming bond pads.

This CLK refresh signal turns on transistors 68-1 through 68-3 of FIG. 2. Thus the inputs of inverters 60-1 through 60-3 of FIG. 2 are biased toward ground through transistors 68-1 through 68-3, both periodically in response to transitions of the $\overline{RAS}$ signal and when an error event is detected on any of the other three input signals to the CLK circuit 69. Those bond pads 54-1 through 54-3 which are not connected to a high voltage signal but which may have erroneously gone to a high voltage state due to electrical noise, will be pulled to a low voltage state and latched at a signal representing a low voltage input signal on the input terminal of inverter 60-1 through 60-3. Those bond pads 54-1 through 54-3 which are connected to $V_{dd}$ will be held up by this connection while CLK pulses to logical 1 and the opposite signal will be provided.

Thus the circuitry allows for the use of a single type of connection between the bond pad and $V_{dd}$ rather than the more complex method requiring two different bonding points providing two different reference voltages. In addition, the described embodiment provides a reliable binary state input mechanism using a single reference voltage.

FIG. 4 is a block diagram showing how the control signals provided by the circuitry of FIG. 2 can select the appropriate signal to be provided to circuitry on the integrated circuit. In this example, multiplexer 78 selects between signal S1 and S2 in response to the signal provided on CLX1 and provides the selected signal as output signal SO. FIG. 5 is a logic diagram showing the pass control of a signal provided by the circuitry of FIG. 2. In this example, the signal provided by CLB1 determines whether the signal provided on SI is passed through to the output of AND gate 80 or whether a logical 0 signal provided on CLB1 locks the output signal of AND gate 80 at a logical 0. Other examples of control of integrated circuit function using the signals provided by the circuitry of FIG. 2 will become obvious to those skilled in the art in light of this specification.

Although a specific embodiments of the present invention are herein described, it is not to be construed as limiting the scope of the invention. The scope of the invention is only limited by the claims appended hereto.

What is claimed is:

1. An integrated circuit having selectable programmable features, comprising:
   a plurality of programming bond pads, said programming bond pads selectably being connected to a reference potential; and
   programming mode circuitry connected to said plurality of programming bond pads for determining which pads are connected to the reference potential and which pads are left unconnected, said programming mode circuitry further providing logical signals on the integrated circuit that select the operational mode of the integrated circuit.

2. The integrated circuit of claim 1 including checking circuitry for determining if the appropriate connected or unconnected state is being detected, said determining action being in response to a detected change in said state.

3. A method of sensing the selected programmable features in an integrated circuit having programming bond pads and a reference voltage, comprising the steps of:
   selectably connecting programming bond pads, from a plurality of programming bond pads, to a reference potential; and
   connecting programming mode circuitry to said plurality of programming bond pads for determining which pads are connected to the reference potential and which pads are left unconnected, said programming mode circuitry further providing logical signals on the integrated circuit for selecting the operational mode of the integrated circuit.

4. An integrated circuit device, comprising:
   a first voltage source corresponding to a first option of the device;
   a second voltage source corresponding to a second option of the device; and
   a bond pad selectively connectable to the first voltage source and coupled to the second voltage source, wherein the device operates in the second option when the bond pad is unconnected to the first voltage source and the device operates in the first option when the bond pad is connected to the first voltage source.

5. The integrated circuit device of claim 4, wherein a transistor couples the bond pad to the second voltage source.

6. The integrated circuit device of claim 5, wherein said transistor is a pull-up transistor.

7. The integrated circuit device of claim 4, including option circuitry, responsive to voltage, to operate the device in a first mode corresponding to a first option and a second mode corresponding to a second option.

8. The integrated circuit device of claim 4, wherein said first and second options are options of semiconductor memory.

9. The integrated circuit device of claim 8, wherein said first option configures the memory device as a X1 memory and the second option configures the memory as a X4 memory.

10. The integrated circuit of claim 9 wherein at least one of said first and second voltage sources is generated within the circuit.

11. The integrated circuit of claim 8, wherein the first option configures the memory device to have a cycle refresh, and the second option configures the device to have a cycle refresh.

12. A mode selection circuit for a semiconductor memory device; comprising:
    a first voltage source corresponding to a first mode of operation for the semiconductor memory device;
    a second voltage source corresponding to a second mode of operation for the semiconductor memory device; and
    a bond pad selectively connectable to the first voltage source and coupled to the second voltage source such that the semiconductor memory device operates in the second mode of operation unless the bond pad is connected to said first voltage source, wherein the semiconductor memory device then operates in the first mode of operation.

13. The mode selection circuit of claim 12, wherein the first mode of operation configures the device as a X1 memory device and the second mode of operation configures the device as a X4 memory device.

14. The mode selection circuit of claim 12, wherein the first mode of operation configures the memory device to have a cycle refresh, and the second mode of operation configures the device to have a cycle refresh.

15. A configuration selection system for a semiconductor device, comprising:
    a bond pad that is conditionally coupled to a first configuration selection voltage; and
    a pull-up transistor coupled between the bond pad and a second configuration voltage, operable to bias the bond pad towards the second configuration voltage when the bond pad is not selectively coupled to the first configuration voltage.

16. The configuration selection system of claim 15, wherein the second configuration voltage is internally generated by the semiconductor device.

17. The configuration selection system of claim 15, wherein the pull-up transistor is a MOS transistor.

18. The configuration selection system of claim 15, including:
    a latch, having an input coupled to the bond pad, and having an output for transmitting the selected mode voltage to the semiconductor device.

19. A semiconductor memory device integrated into a single semiconductor substrate that is bond programmable to select different options, comprising:
    an array of memory cells;

support circuitry to read information from the memory cells and write information to the memory cells;

option circuitry, responsive to voltage, to operate the array and support circuitry in different modes;

a bond pad connected to the option circuitry, coupled to a first voltage, and bondable to a second voltage; and wherein the option circuitry operates the array and support circuitry in one mode when the bond pad is not bonded to the second voltage and wherein the option circuitry operates the array and support circuitry in another mode when the bond pad is bonded to the first voltage.

20. The semiconductor memory device of claim 19, wherein said first voltage is a positive voltage.

21. The semiconductor memory device of claim 20, wherein the second voltage is ground voltage.

22. The semiconductor memory device of claim 20, wherein the first option is X4 memory and the second option is X1 memory.

23. A method for providing a mode control to a semiconductor device; comprising the steps of:
coupling a bond pad to a first voltage to operate the device in a first mode; and
coupling the bond pad to a second voltage to operate the device in a second mode.

24. The method of claim 23, wherein said coupling is by means of bonding the bond pad.

25. The method of claim 23, wherein said coupling is by means of a scheduled bonding step in production of a device of the second option.

26. A method as claimed in claim 25, wherein said scheduled bonding step is omitted in production of a device of the first option.

27. A method for providing a mode control to a semiconductor device; comprising the steps of:
bonding a bond pad to a first voltage to operate the semiconductor device in a first mode; and
operating the device in a second mode of operation when the bond pad is not selectively bonded to the first voltage.

28. The integrated circuit device of claim 2 wherein said checking circuitry refreshes the sensing of the programmed state.

29. The integrated circuit of claim 2 wherein said determining action is performed continuously or repetitively.

30. The method of claim 3 including circuitry for determining if the appropriate connected or unconnected state is being detected, said determining action being in response to a detected change in said state.

31. The method of claim 30 wherein said determining action is performed continuously or repetitively.

* * * * *